United States Patent
Rao et al.

(10) Patent No.: US 8,665,638 B2
(45) Date of Patent: Mar. 4, 2014

(54) MRAM SENSING WITH MAGNETICALLY ANNEALED REFERENCE CELL

(75) Inventors: Hari M. Rao, San Diego, CA (US); Xiaochun Zhu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 194 days.

(21) Appl. No.: 13/179,631

(22) Filed: Jul. 11, 2011

(65) Prior Publication Data

US 2013/0016553 A1    Jan. 17, 2013

(51) Int. Cl.
*G11C 11/00* (2006.01)

(52) U.S. Cl.
USPC ........... 365/158; 365/148; 365/171; 977/933; 977/935

(58) Field of Classification Search
USPC ......... 365/48, 55, 62, 66, 74, 78, 80–93, 100, 365/130, 131, 148, 158, 171–173, 209, 213, 365/225.5, 230.07, 232, 243.5; 257/295, 257/421, 422, 427, E21.665, E27.006; 438/3; 977/933–935
See application file for complete search history.

(56) References Cited

U.S. PATENT DOCUMENTS

| | | | |
|---|---|---|---|
| 7,286,378 B2 | 10/2007 | Nazarian | |
| 7,499,314 B2 | 3/2009 | Yang et al. | |
| 7,577,021 B2 * | 8/2009 | Guo et al. | 365/158 |
| 7,751,258 B2 | 7/2010 | Tsuchida | |
| 7,755,933 B2 * | 7/2010 | Guo et al. | 365/158 |
| 7,760,544 B2 * | 7/2010 | Guo et al. | 365/158 |
| 7,764,539 B2 * | 7/2010 | Guo et al. | 365/158 |
| 7,924,607 B2 * | 4/2011 | Yoshikawa et al. | 365/158 |
| 8,023,309 B2 * | 9/2011 | Tanaka et al. | 365/145 |
| 2004/0240255 A1 | 12/2004 | Smith et al. | |
| 2008/0285360 A1 | 11/2008 | Sakimura et al. | |
| 2009/0129143 A1 * | 5/2009 | Guo et al. | 365/158 |
| 2009/0201710 A1 | 8/2009 | Ueda | |
| 2009/0296455 A1 * | 12/2009 | Guo et al. | 365/158 |
| 2009/0296456 A1 * | 12/2009 | Guo et al. | 365/158 |
| 2009/0298200 A1 * | 12/2009 | Guo et al. | 438/3 |
| 2010/0157654 A1 | 6/2010 | Jung et al. | |

OTHER PUBLICATIONS

Au, E.K.S. et al., "A novel current-mode sensing scheme for magnetic tunnel junction MRAM." Dept. of Electr. & Electron. Eng., Hong Kong Univ. of Sci. & Technol., China. Issue Date: Mar. 2004; vol. 40 , Issue: 2, pp. 483-488.
International Search Report and Written Opinion—PCT/US2012/046313—ISA/EPO—Oct. 26, 2012.

* cited by examiner

*Primary Examiner* — Harry W Byrne
(74) *Attorney, Agent, or Firm* — Sam Talpalatsky; Nicholas J. Pauley; Joseph Agusta

(57) ABSTRACT

Systems and method for reading/sensing data stored in magnetoresistive random access memory (MRAM) cells using magnetically annealed reference cells. A MRAM includes a reference circuit comprising at least one magnetic storage cell, wherein each magnetic storage cell in the MRAM is programmed to the same state. The reference circuit includes a load element coupled to the magnetic storage cell, wherein the load element is configured to establish a reference voltage during a read operation.

11 Claims, 9 Drawing Sheets

PARALLEL MAGNETIZATION
LOW RESISTANCE
STATE "0"

ANTIPARALLEL MAGNETIZATION
HIGH RESISTANCE
STATE "1"

READ & WRITE

MRAM SENSING WITH MAGNETICALLY ANNEALED REFERENCE CELL

FIELD OF DISCLOSURE

Disclosed embodiments are directed to reading/sensing Magnetoresistive Random Access Memory (MRAM) cells. More particularly, disclosed embodiments are directed to reading/sensing data stored in MRAM cells using magnetically annealed reference MRAM cells.

BACKGROUND

Magnetoresistive Random Access Memory (MRAM) is a non-volatile memory technology that has response (read/write) times comparable to volatile memory. In contrast to conventional RAM technologies which store data as electric charges or current flows, MRAM uses magnetic elements. As illustrated in FIGS. 1A and 1B, a magnetic tunnel junction (MTJ) storage element 100 can be formed from two magnetic layers 110 and 130, each of which can hold a magnetic field, separated by an insulating (tunnel barrier) layer 120. One of the two layers (e.g., fixed layer 110), is set to a particular polarity. The other layer's (e.g., free layer 130) polarity 132 is free to change to match that of an external field that can be applied. A change in the polarity 132 of the free layer 130 will change the resistance of the MTJ storage element 100. For example, when the polarities are aligned, FIG. 1A (parallel "P" magnetization low resistance state "0"), a low resistance state exists. When the polarities are not aligned, FIG. 1B (anti-parallel "AP" magnetization high resistance state "1"), then a high resistance state exists. The illustration of MTJ 100 has been simplified and those skilled in the art will appreciate that each layer illustrated may comprise one or more layers of materials, as is known in the art.

Referring to FIG. 2, a memory cell 200 of a conventional MRAM is illustrated for a read operation. The cell 200 includes a transistor 210, bit line 220, digit line 230 and word line 240. The cell 200 can be read by measuring the electrical resistance of the MTJ 100. For example, a particular MTJ 100 can be selected by activating an associated transistor 210 (transistor on), which can switch current from a bit line 220 through the MTJ 100. Due to the tunnel magnetoresistive effect, the electrical resistance of the MTJ 100 changes based on the orientation of the polarities in the two magnetic layers (e.g., 110, 130), as discussed above. The resistance inside any particular MTJ 100 can be determined from the current, resulting from the polarity of the free layer. Conventionally, if the fixed layer 110 and free layer 130 have the same polarity, the resistance is low and a "0" is read. If the fixed layer 110 and free layer 130 have opposite polarity, the resistance is higher and a "1" is read.

Unlike conventional MRAM, Spin Transfer Torque Magnetoresistive Random Access Memory (STT-MRAM) uses electrons that become spin-polarized as the electrons pass through a thin film (spin filter). STT-MRAM is also known as Spin Transfer Torque RAM (STT-RAM), Spin Torque Transfer Magnetization Switching RAM (Spin-RAM), and Spin Momentum Transfer (SMT-RAM). During the write operation, the spin-polarized electrons exert a torque on the free layer, which can switch the polarity of the free layer. The read operation is similar to conventional MRAM in that a current is used to detect the resistance/logic state of the MTJ storage element, as discussed in the foregoing. As illustrated in FIG. 3A, a STT-MRAM bit cell 300 includes MTJ 305, transistor 310, bit line 320 and word line 330. The transistor 310 is switched on for both read and write operations to allow current to flow through the MTJ 305, so that the logic state can be read or written.

Referring to FIG. 3B, a more detailed diagram of a STT-MRAM cell 301 is illustrated, for further discussion of the read/write operations. In addition to the previously discussed elements such as MTJ 305, transistor 310, bit line 320 and word line 330, a source line 340, sense amplifier 350, read/write circuitry 360 and bit line reference 370 are illustrated. As discussed above, during a read operation, a read current is generated, which flows between the bit line 320 and source line 340 through MTJ 305. When the current is permitted to flow via transistor 310, the resistance (logic state) of the MTJ 305 can be sensed based on the voltage differential between the bit line 320 and source line 340, which is compared to a reference 370 and then amplified by sense amplifier 350. Those skilled in the art will appreciate the operation and construction of the memory cell 301 is known in the art. Additional details are provided, for example, in M. Hosomi, et al., A Novel Nonvolatile Memory with Spin Transfer Torque Magnetoresistive Magnetization Switching: Spin-RAM, proceedings of IEDM conference (2005), which is incorporated herein by reference in its entirety.

With reference now to FIG. 4, a circuit diagram for a conventional implementation of certain elements of FIG. 3B is illustrated. Specifically, FIG. 4 illustrates circuit implementations of reference 370 (reference current sensing) and sense amplifier 350 (voltage sensing) as employed during a read operation on STT-MRAM data cell 401 comprising MTJ 305 and transistor 310. As shown, a reference cell 402 comprises reference MTJ 404 and reference MTJ 406. The two reference MTJs 404 and 406 are programmed to "0" (P) and "1" (AP) states respectively before commencement of read/write operations. Load PMOS transistors 410 and 412 are coupled to the two reference MTJs 404 and 406 respectively, as shown in FIG. 4, such that a reference voltage "ref_in" is generated at node 408. One of ordinary skill will recognize that reference voltage ref_in corresponds to an average or mid-point voltage between voltages corresponding to the "0" and "1" states programmed in reference MTJs 404 and 406.

During a read operation, the data value stored in data cell 401 is evaluated as follows. The "read_en" signal is activated, such that current is flowed through data current sensing circuit 460. Activation of the word line, bit line, and source line corresponding to data cell 401 causes transistors 310, 416 and 418 to turn on and allow current to flow through MTJ 305. Load PMOS 424 enables a corresponding voltage, "data_in" to be generated at node 414. Comparison of voltage data_in with reference voltage ref_in, yields the state/value stored in data cell 401, wherein, if data_in is higher than ref_in, it can be determined that the value stored in data cell 401 is "1"; and if data_in is lower than ref_in, it can be determined that the value stored in data cell 401 is "0".

The comparison of reference voltage ref_in and voltage data_in, and subsequent sensing of the value stored in data cell 401 is performed in sense amplifier 350. A pair of cross coupled inverters 420 and 422 magnify the voltage difference between data_in and ref_in to generate differential outputs "sao" and "saob" which correspond to the data value stored in data cell 401.

The above described conventional implementation for sensing the value stored in data cell 401 suffers from several limitations. Firstly, it is necessary to program reference cells, such as reference MTJs 404 and 406 to "0" and "1" values before read operations can be performed on data cells, such as data cell 401. This pre-programming or preparing of reference cells may give rise to several errors such as stuck-at faults, which may result in erroneous sensing of the value stored in the data cells. Secondly, design defects may cause shifting of the reference value ref_in to a value other than the ideal case value that is midway between "0" and "1", such that a sensing margin for sensing the value stored in data cells, may be adversely affected. Thirdly, the utilization of two reference cells, one programmed to "0" and the other programmed to "1", consumes valuable area on the chip, and therefore tends to be costly to implement.

Accordingly, there is a need in the art for avoiding the above described limitations associated with conventional reference cell implementations for MRAM.

SUMMARY

Exemplary embodiments of the invention are directed to systems and method for reading/sensing data stored in MRAM cells using magnetically annealed reference MRAM cells.

For example, an exemplary embodiment is directed to a magnetoresistive random access memory (MRAM) having a reference circuit comprising: at least one magnetic storage cell, wherein each magnetic storage cell in the MRAM is programmed to the same state; and a load element coupled to the magnetic storage cell, wherein the load element is configured to establish a reference voltage during a read operation.

Another exemplary embodiment is directed to method of forming a reference circuit for a magnetoresistive random access memory (MRAM), the method comprising: forming at least one magnetic storage cell, wherein each magnetic storage cell in the MRAM is programmed to the same state; and coupling a load element to the magnetic storage cell, wherein the load element is configured to establish a reference voltage during a read operation.

Yet another exemplary embodiment is directed to a method of forming a reference circuit for a magnetoresistive random access memory (MRAM), the method comprising: step for forming at least one magnetic storage cell, wherein each magnetic storage cell in the MRAM is programmed to the same state; and step for coupling a load element to the magnetic storage cell, wherein the load element is configured to establish a reference voltage during a read operation.

A further exemplary embodiment is directed to magnetoresistive random access memory (MRAM) having a reference circuit comprising: means for forming at least one magnetic storage cell, wherein each magnetic storage cell in the MRAM is programmed to the same state; and means for coupling a load element to the magnetic storage cell, wherein the load element is configured to establish a reference voltage during a read operation.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Figure 1A:
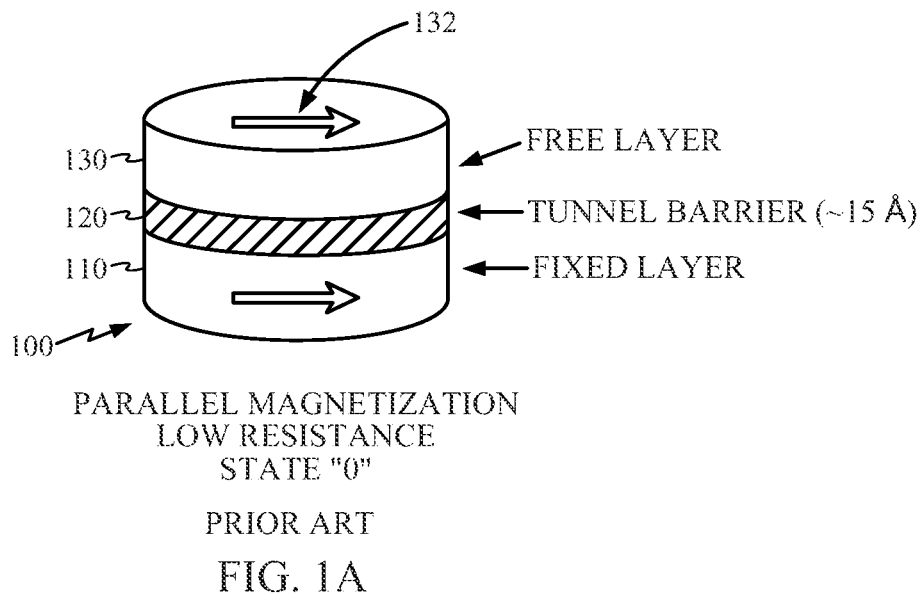
FIGS. 1A and 1B are illustrations of a magnetic tunnel junction (MTJ) storage element.
Figure 1B:
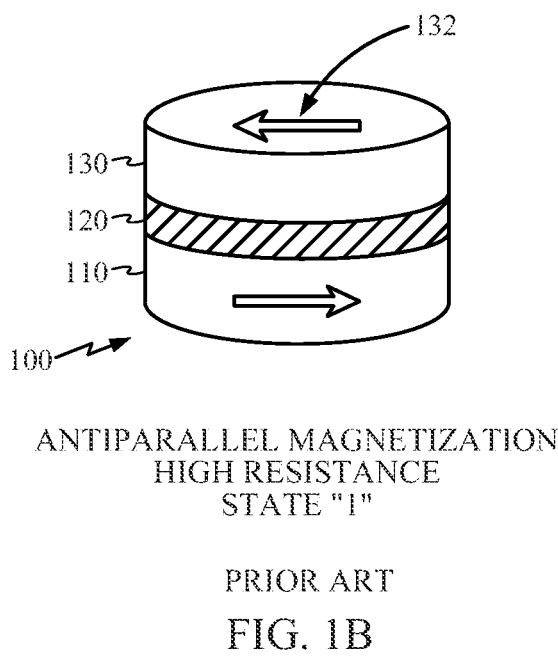
Figure 2:
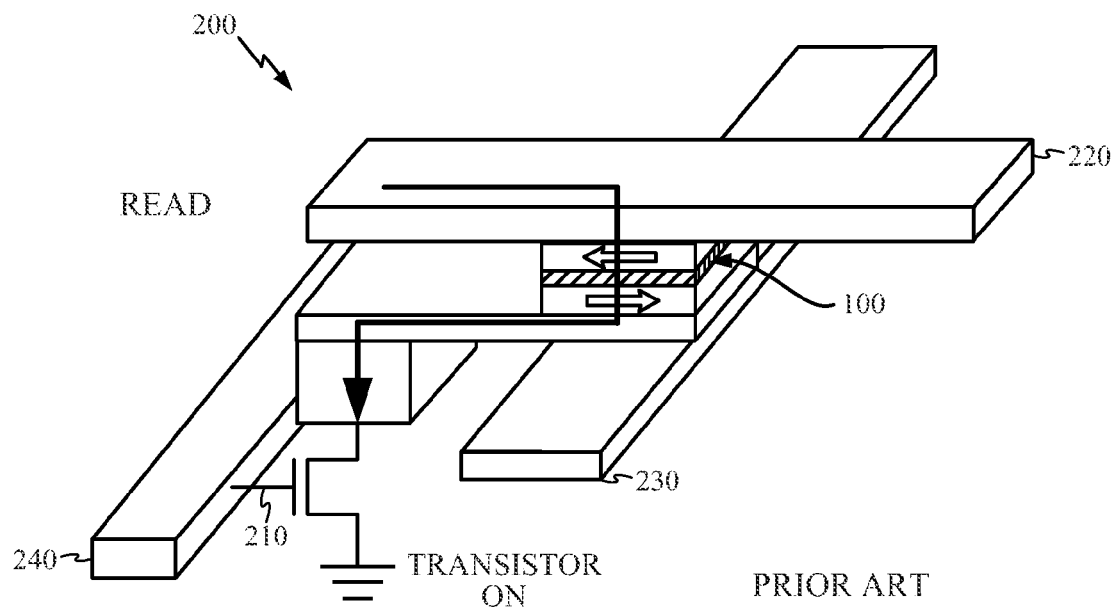
FIG. 2 is an illustration of a Magnetoresistive Random Access Memory (MRAM) cell during read operations.
Figure 3A:
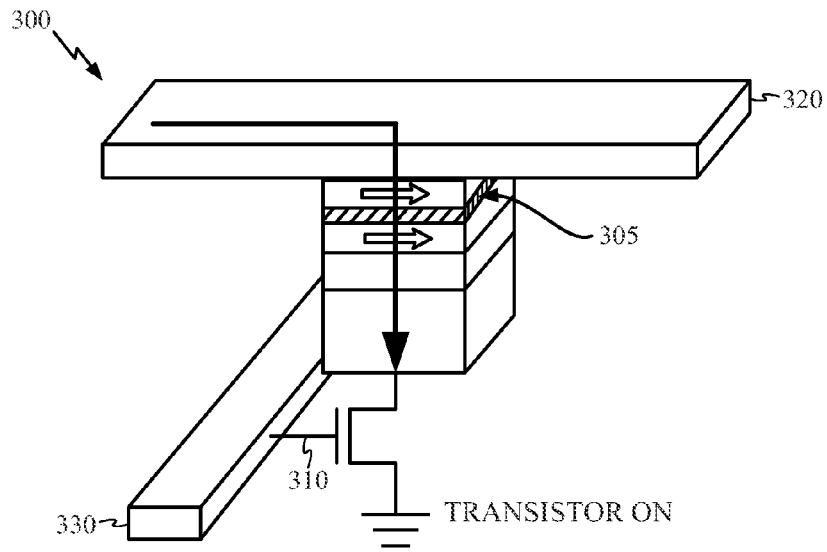
FIGS. 3A and 3B are illustrations of Spin Transfer Torque Magnetoresistive Random Access Memory (STT-MRAM) cells.
Figure 3B:
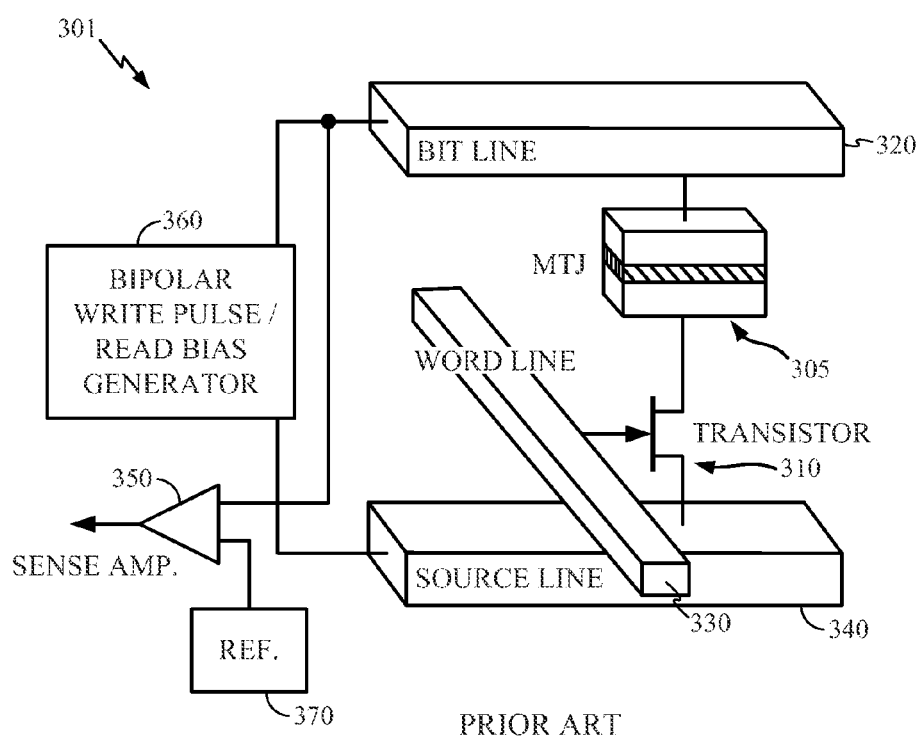
Figure 4:
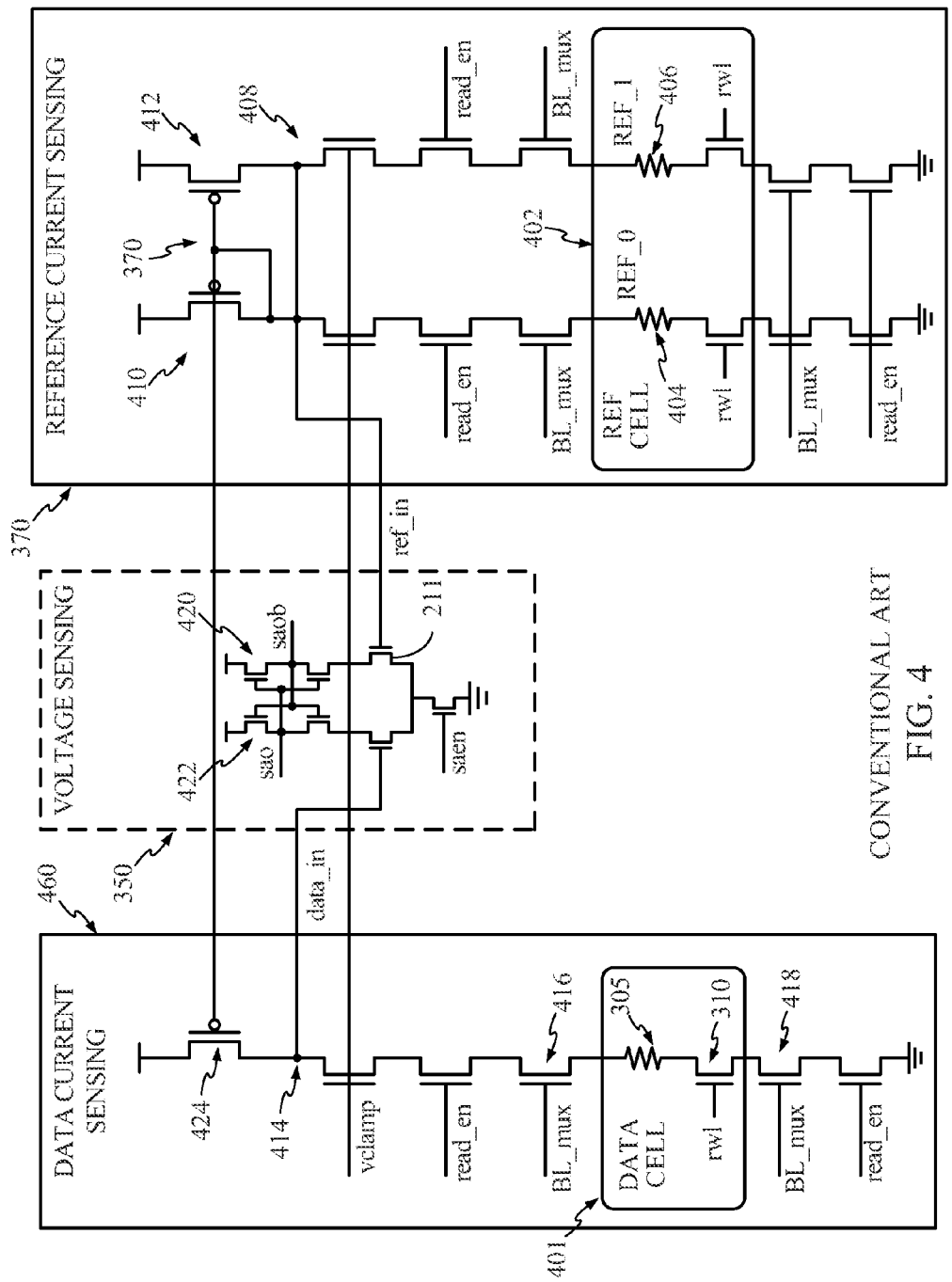
FIG. 4 is an illustration of a circuit diagram for a conventional implementation of certain elements of FIG. 3B.

Exemplary embodiments avoid the problems associated with conventional reference cells, such as reference 370 in FIGS. 3-4. The embodiments are not limited in requiring a pair of reference cells programmed to "0" and "1" values in order to generate a reference value that is midway between "0" and "1".

Exemplary embodiments recognize that magnetic annealing causes MTJs to be polarized to anti-parallel (AP) state. Magnetic annealing is a process that is commonly a part of the fabrication process of MRAM wafers, wherein the wafers are annealed and cooled in the presence of strong magnetic fields. Before the process of magnetic annealing, the wafers are at room temperature, and the wafers' atomic magnetic moments are randomly scattered, without a well defined orientation. During the process of magnetic annealing, the wafers are placed in an oven and heated up to temperatures of 400 C, while under the influence of a powerful magnetic field. This temperature is maintained for about six hours, which causes the atomic moments to orient in a desired direction, based on the applied magnetic field. Thereafter, the temperature is reduced and the wafers are allowed to slowly anneal/cool. Once the temperatures are reduced back to room temperature, the atomic moments are fixed according to the applied magnetic fields, such that the free layers are oriented in an opposite direction of the fixed layers. Accordingly, post magnetic annealing, MTJ cells in MRAM wafers are generally available in the AP state.

Usually, the native state of MTJ cells available after fabrication of MRAM wafers is AP state. However, it is possible to make suitable modifications to the fabrication process such that all MTJ cells in an MRAM wafer may become available in the P state post magnetic annealing. While description of exemplary embodiments is provided herein with respect to MTJ cells in AP state post magnetic annealing, it will be appreciated that embodiments may be directed to MTJ cells programmed to a same state, wherein the same state may be AP or P.

As previously discussed, the AP state is commonly designated as the "0" state for storing binary data in MTJ cells. Exemplary embodiments utilize a single MTJ cell in its native AP/"0" state to generate a reference voltage value. The embodiments include a PMOS load of programmable strength, configured to pull up the voltage corresponding to the "0" state to a reference voltage level that is midway between "0" and "1". It will be understood that while reference is made herein to voltages corresponding to "0" and "1" states, the embodiments are not restricted to particular voltage values. As one example, "0" and "1" states may correspond to ground voltage and positive supply voltage respectively. One of ordinary skill will recognize other suitable implementations for designating appropriate voltage values to "0" and "1" states. In like manner, reference will be made herein for the reference voltage to be midway between "0" and "1". However, as can be seen, the reference voltage is not to be construed as limited to a value of 0.5 v in exemplary embodiments. On the other hand, the reference voltage is an appropriate value which enables sensing of data as "0" or "1" based on comparisons with the reference voltage, while ensuring required sensing margins.

Figure 5:
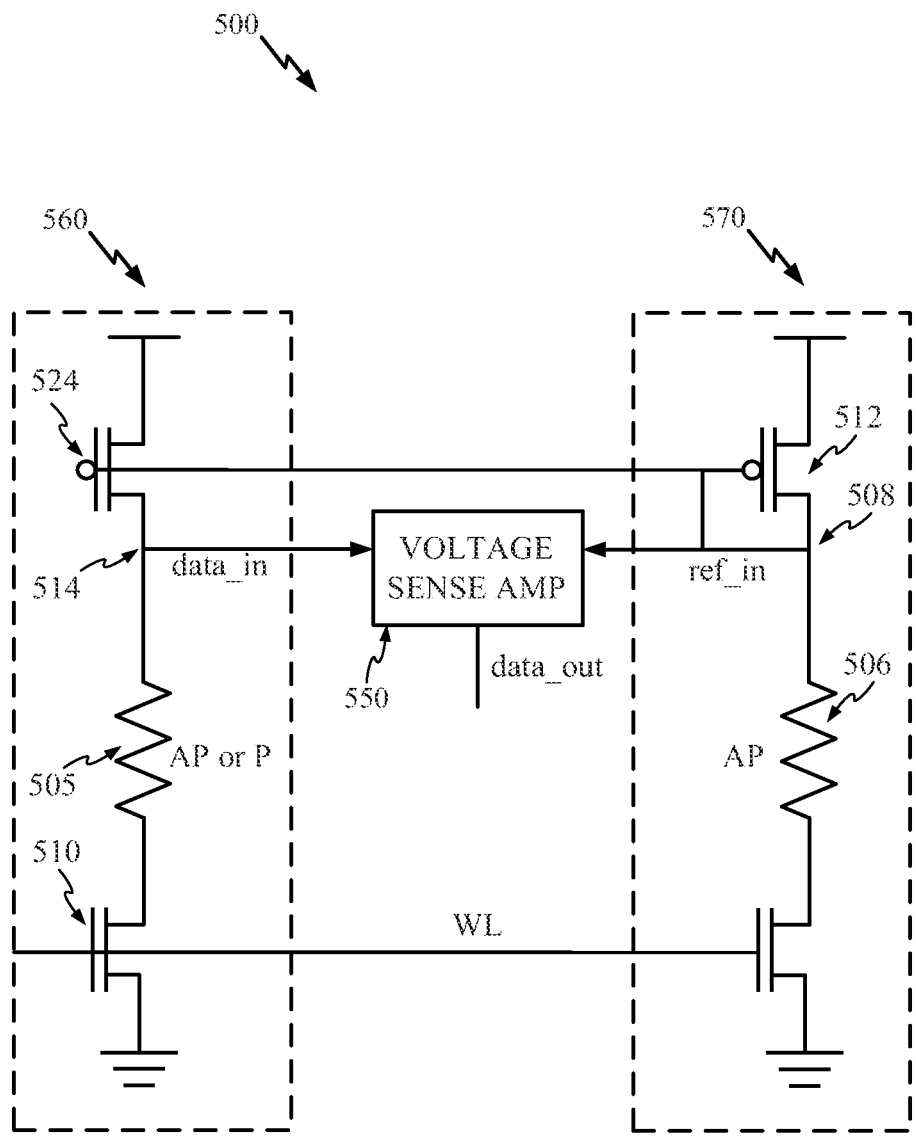
FIG. 5 is a simplified schematic diagram for a sensing circuit according to exemplary embodiments.

Referring to FIG. 5, a simplified schematic diagram for sensing circuit 500, according to exemplary embodiments, is illustrated. As shown, reference circuit 570 comprises a single reference MTJ 506 in its native AP/"0" state, with load PMOS 512. MTJ 505 stores the data value to be read, wherein the data value may correspond to either AP or P state. Data current sensing circuit 560 includes load 524, and transistor 510 for facilitating the flow of current through MTJ 505. The voltage at node 514 (data_in) corresponds to the data value stored in MTJ 505. As such, the voltage at node 508 (ref_in) will correspond to the "0" state in reference MTJ 506. The strength of load PMOS 512 may be adjusted in order to pull up the voltage at node 508 (ref_in) from "0" to the desired reference voltage that is midway between "0" and "1". Voltage sense amplifier 550 operates similar to sense amplifier 350 (as shown in FIG. 4), in comparing voltages at nodes 508 (data_in) and 508 (ref_in), in order to determine the data value stored in MTJ 505 and output the same as "data_out".

Exemplary embodiments will now be described for adjusting the strength of load PMOS 512 accordingly. In one example, the reference voltage at node 508 may be shifted from "0" to midway between "0" and "1" by resizing PMOS 512 appropriately to increase its pull up strength. However, it may be difficult to accurately control the pull up strength in this manner. Process variations may render the sensing margins unacceptable.

Figure 6:
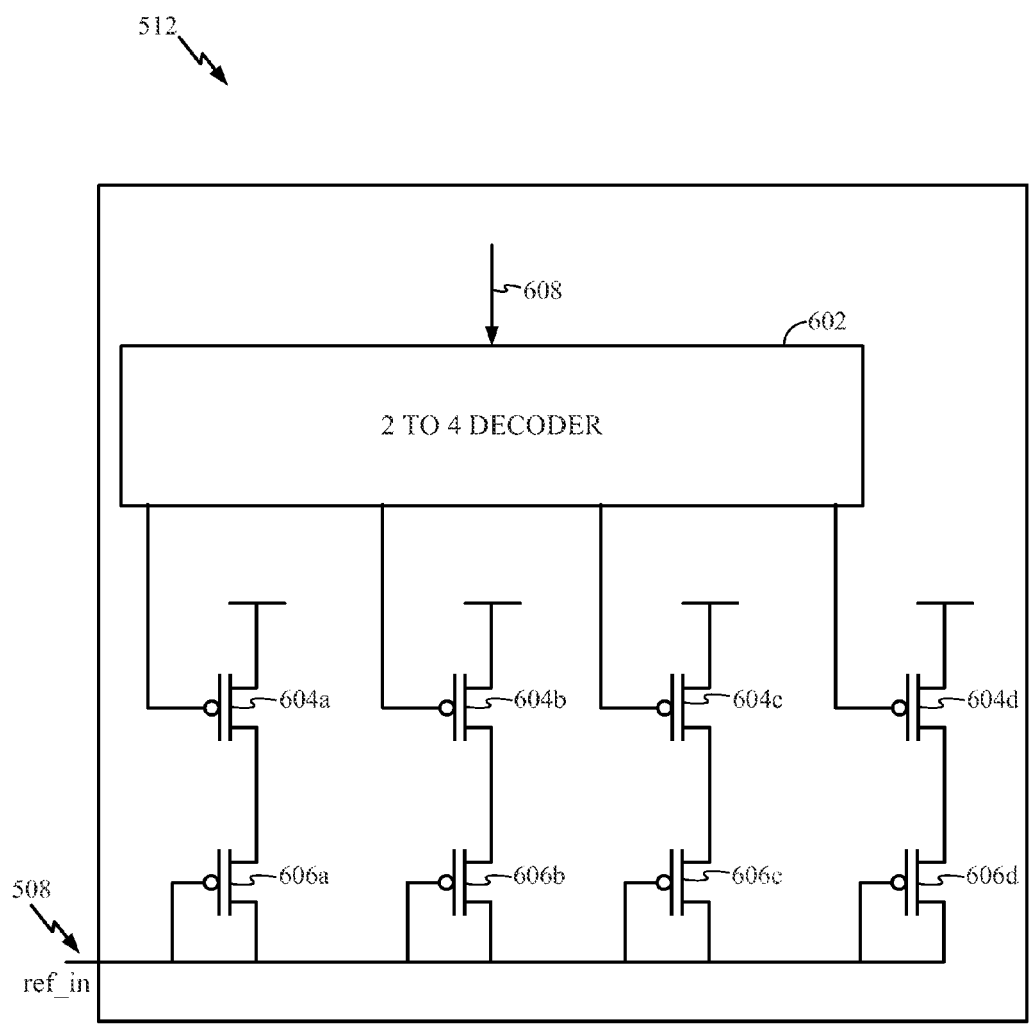
FIG. 6 is an illustration of a PMOS load with programmable strength.

With reference now to FIG. 6, an exemplary implementation for a PMOS load with programmable strength is illustrated. The programmable PMOS load 512, as illustrated, comprises two or more legs connected in parallel. A subset of the legs may be enabled in order to achieve a desired pull up strength. Each leg comprises two PMOS transistors connected in series, such as 604a and 606a. The leg may be enabled by controlling the gate voltage of 604a. For example, by setting the gate voltage of 604a to "0" or ground voltage, 604a is turned on, and the leg's combined drive strength of 604a and 606a is contributed to the drive strength of PMOS load 512. Decoder 602 may be used to decode control signals 608, wherein the control signals 608 indicate which legs are to be turned on. In FIG. 6, four legs comprising the pairs {604a, 606a}, {604b, 606b}, {604c, 606c}, and {604d, 606d}, are illustrated. In the case wherein pull up strengths of each leg is the same, programming the control signals 608 accordingly can provide four discrete pull up strength values—based on whether one, two, three, or four legs are enabled. Skilled persons will recognize suitable variations for implementing the programmable PMOS load 512.

With continuing reference to FIG. 6, the reference voltage "ref_in" at node 508 may be pulled up to the desired voltage value midway between "0" and "1" by programming the drive strength of load PMOS 512 as described. Accordingly, the reference voltage, and subsequently the sensing margins, can be precisely controlled by using a single reference MTJ cell in its native AP/"0" state.

However, it may be possible that process defects may affect the polarization of MTJ cells during fabrication of the MRAM wafers. Accordingly, reference MTJ cells may not be available in the AP state post magnetic annealing. If such faults occur in exemplary embodiments, the reference MTJ cells may be easily reprogrammed to the AP state by using a "mono" pulse. A mono pulse may be derived from a system reset signal, and may be delivered to reference MTJ cells, such that they may be flash programmed to AP state before read operations are performed.

In some cases, it may also be possible that reference MTJ cells may become polarized in the P state, as opposed to the expected AP state, post magnetic annealing. The reference MTJ cells may also be stuck at a P state due to other process defects, stuck-at faults, etc. Such faults comprising reference MTJ cells stuck at a P state may be easily detected in exemplary embodiments. For example, with reference to FIG. 5, if the reference MTJ cell 506 is stuck at a faulty P/"1" state, then the reference voltage ref_in generated at node 508 would be much lower than the expected midway voltage between "0" and "1". In fact, due to the way the load PMOS circuits are programmed, the reference voltage ref_in would be negative, i.e. below a voltage value corresponding to those of both "0" and "1". Accordingly, when this reference voltage ref_in is compared with data_in during a read operation, the comparison would cause a value of "1" to be sensed for both data values "0" and "1" stored in data cell MTJ 505. Thus, stuck-at faults wherein the reference MTJ cells are stuck at a faulty P state may be effectively detected by performing read operations on known data values of "0" and "1". If such faults are discovered, they may be easily rectified by writing the reference MTJ cell to the desired AP/"0" state.

Stuck-at faults may also occur in data cells. In order to determine whether the source of the fault lies in the reference cells or the data cells, write current patterns corresponding to write operations on data cells may be observed. If the data write current changes as expected with write operations of "0" and "1" on the data cells, it may be determined that the fault lies in the reference cells. On the other hand, if the write current remains constant and invariant between write operations of "0" and "1" on the data cells, it may be determined that the data cells are inflicted with stuck-at faults. Once the faulty cells are identified, they may be rectified by known techniques, such as writing the correct value to the faulty cell.

Figure 7:
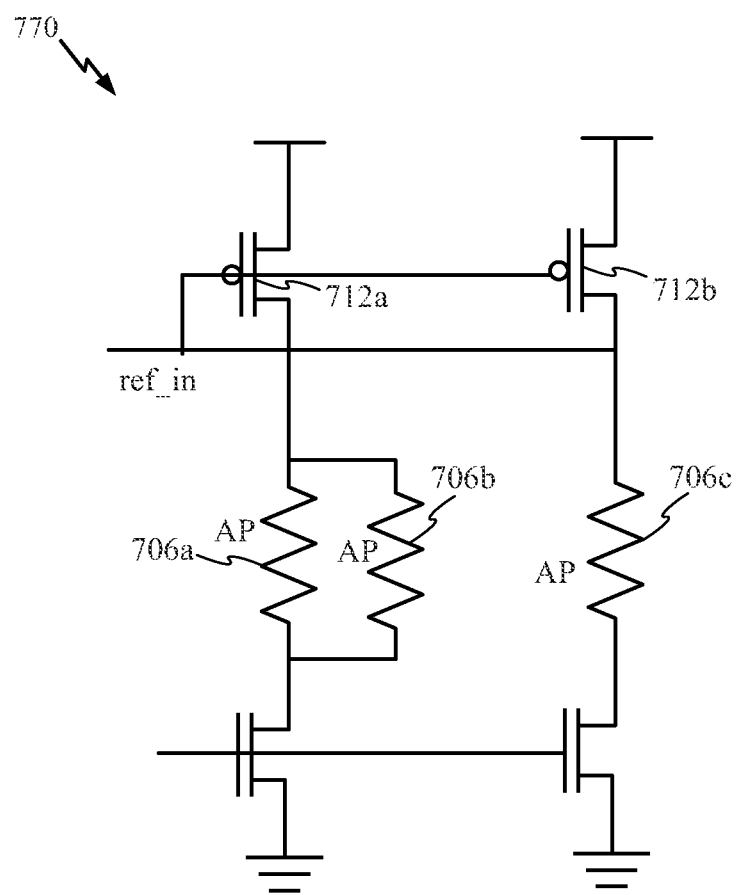
FIG. 7 is an illustration of a reference cell formed from coupling multiple MRAM cells in AP state.

While exemplary embodiments have been described with a single reference MTJ cell in the native AP state, embodiments can also include two or more reference MTJ cells in AP state, coupled as shown in FIG. 7. With reference to FIG. 7, multiple reference MTJ cells, 706a, 706b, and 706c are coupled to form the reference 770. Reference 770 may substantially retain the circuit structure of conventional reference circuit architectures such as reference 370 (as shown in FIG. 4). The parallel coupling of reference MTJ cells 706a and 706b in the AP state effectively acts as a reference MTJ cell in P state. Thus, reference 770 may be configured to effectively comprise a reference MTJ cell in P state (parallel coupling of reference MTJ cells 706a and 706b); and a reference MTJ cell in AP state (reference MTJ cell 706c). Accordingly, reference 770 may be configured to retain the same bitcell footprint of conventional reference circuits such as reference 370. Thus, exemplary embodiments may use MTJ cells available in native AP state for configuring reference circuits which substantially retain bitcell footprints of conventional reference circuits. The load PMOS transistors 712a and 712b are appropriately sized or programmed in order to generate the required reference voltage value ref_in. Skilled persons will recognize variations of reference circuit 770, wherein multiple reference MTJ cells in the native AP state are electrically coupled with load PMOS transistors to generate desired reference voltage values.

Accordingly, exemplary embodiments comprise reference circuits, for reading/sensing operations, formed from reference MTJ cells in a same state, such as the native AP state available post magnetic annealing. Reference voltage levels are precisely controlled to desired voltage values, by programming drive strengths of load elements, such as load PMOS circuits. Compared to conventional reference circuits comprising two reference cells pre-programmed to "0" and "1" states, exemplary embodiments with single reference MTJ cells in native AP state improve yield, sensing margins, tolerance to process variations and ease of testing.

Figure 8:
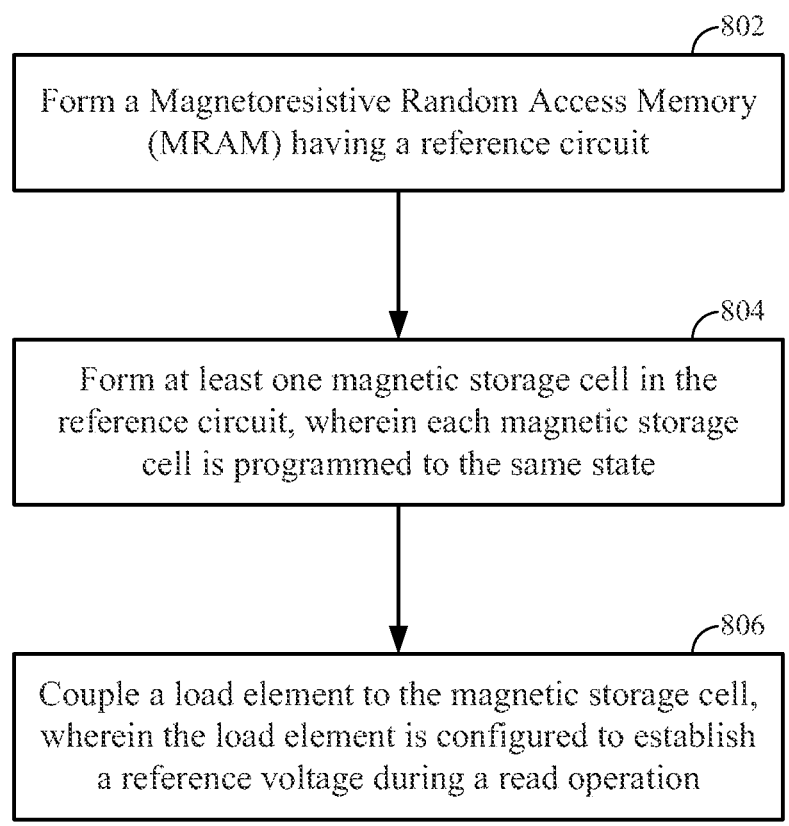
FIG. 8 is a flow chart illustrating a method of sensing Magnetoresistive Random Access Memory (MRAM).

It will be appreciated that embodiments include various methods for performing the processes, functions and/or algorithms disclosed herein. For example, as illustrated in FIG. 8, an embodiment can include a method of sensing Magnetoresistive Random Access Memory (MRAM) comprising: forming an MRAM having a reference circuit (Block 802); forming at least one magnetic storage cell in the reference circuit, wherein each magnetic storage cell is programmed to the same state (Block 804); and coupling a load element to the magnetic storage cell, wherein the load element is configured to establish a reference voltage during a read operation (Block 806).

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

Figure 9:
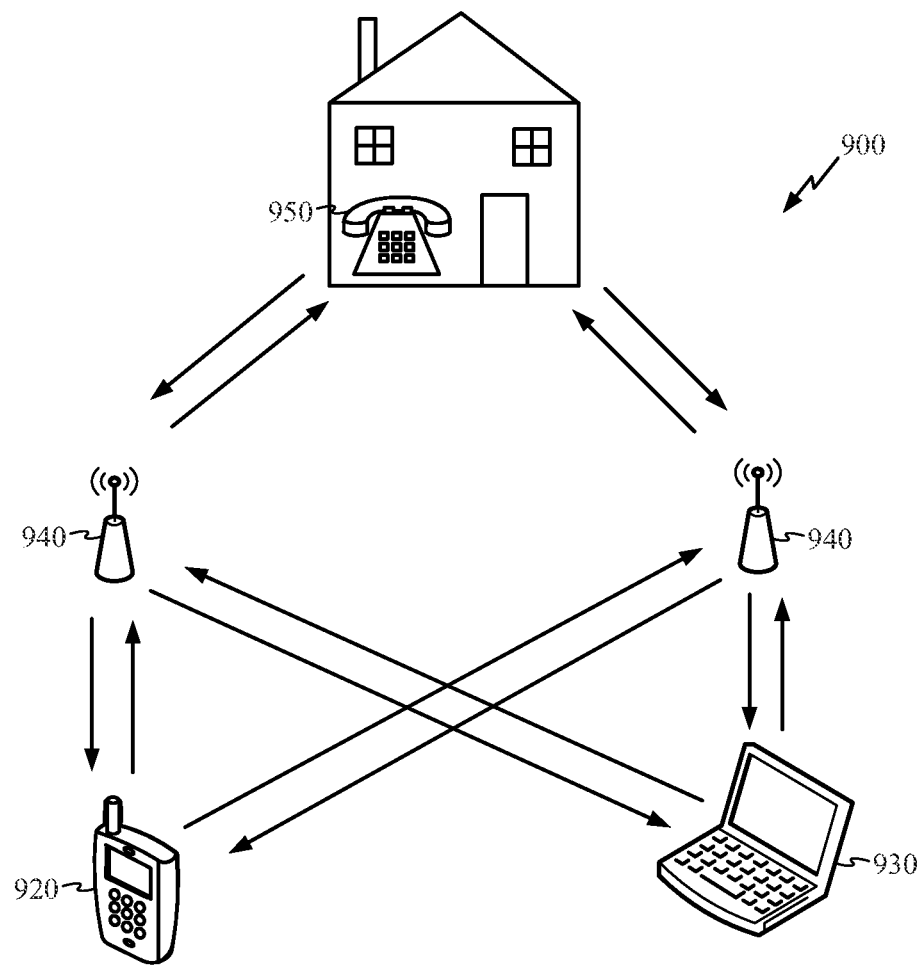
FIG. 9 illustrates remote units wherein exemplary embodiments may be suitably employed.

FIG. 9 illustrates an exemplary wireless communication system 900 in which an embodiment of the disclosure may be advantageously employed. For purposes of illustration, FIG. 9 shows three remote units 920, 930, and 950 and two base stations 940. In FIG. 9, remote unit 920 is shown as a mobile telephone, remote unit 930 is shown as a portable computer, and remote unit 950 is shown as a fixed location remote unit in a wireless local loop system. For example, the remote units may be mobile phones, hand-held personal communication systems (PCS) units, portable data units such as personal data assistants, GPS enabled devices, navigation devices, settop boxes, music players, video players, entertainment units, fixed location data units such as meter reading equipment, or any other device that stores or retrieves data or computer instructions, or any combination thereof. Although FIG. 9 illustrates remote units according to the teachings of the disclosure, the disclosure is not limited to these exemplary illustrated units. Embodiments of the disclosure may be suitably employed in any device which includes active integrated circuitry including memory and on-chip circuitry for test and characterization.

The foregoing disclosed devices and methods are typically designed and are configured into GDSII and GERBER computer files, stored on a computer readable media. These files are in turn provided to fabrication handlers who fabricate devices based on these files. The resulting products are semiconductor wafers that are then cut into semiconductor die and packaged into a semiconductor chip. The chips are then employed in devices described above.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for sensing MRAM cells. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A magnetoresistive random access memory (MRAM) having a reference circuit, the reference circuit comprising:
   one or more magnetic storage cells, wherein each of the one or more magnetic storage cells in the reference circuit is programmed to a same logic state, wherein the same logic state is one of a logic high state or a logic low state; and
   one or more load elements electrically coupled to the one or more magnetic storage cells, wherein the one or more load elements are configured to establish a reference voltage based on their respective drive strengths, during a read operation.

2. The MRAM of claim 1, wherein the established reference voltage is compared to a voltage of a memory element of the MRAM in order to read a value stored in the memory element.

3. The MRAM of claim 1, wherein the same logic state is an anti-parallel state.

4. The MRAM of claim 3, wherein the anti-parallel state is established by a magnetic annealing process.

5. The MRAM of claim 1, wherein the same logic state is a parallel state.

6. The MRAM of claim 1, wherein at least one of the one or more the magnetic storage cells is a Magnetic Tunnel Junction (MTJ) cell.

7. The MRAM of claim 1, wherein at least one of the one or more the load elements is a transistor.

8. The MRAM of claim 7, wherein the transistor is a programmable transistor.

9. The MRAM of claim 8, wherein the programmable transistor comprises two or more legs of transistors coupled in parallel, such that individual legs can be selectively enabled and such that the drive strength of the programmable transistor is proportional to the number of legs enabled.

10. The MRAM of claim 1 integrated in at least one semiconductor die.

11. The MRAM of claim 1, integrated into a device selected from the group consisting of a set top box, music player, video player, entertainment unit, navigation device, communications device, personal digital assistant (PDA), fixed location data unit, and a computer.

* * * * *